United States Patent
Tseng et al.

(10) Patent No.: US 12,429,931 B2
(45) Date of Patent: *Sep. 30, 2025

(54) TWO-STAGE FIXING DEVICE

(71) Applicant: HANWIT PRECISION INDUSTRIES LTD., New Taipei (TW)

(72) Inventors: Ying-Chih Tseng, New Taipei (TW); Ming-De Wu, New Taipei (TW); Ching-Kai Chang, New Taipei (TW)

(73) Assignee: HANWIT PRECISION INDUSTRIES LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/598,511

(22) Filed: Mar. 7, 2024

(65) Prior Publication Data

US 2024/0414904 A1    Dec. 12, 2024

(30) Foreign Application Priority Data

Jun. 6, 2023  (TW) ................................ 112121101

(51) Int. Cl.
*G06F 1/18*     (2006.01)
*H05K 7/14*     (2006.01)

(52) U.S. Cl.
CPC .......... *G06F 1/185* (2013.01); *H05K 7/1417* (2013.01)

(58) Field of Classification Search
CPC .............................. G06F 1/185; H05K 7/1417
See application file for complete search history.

(56) References Cited

U.S. PATENT DOCUMENTS

| | | | |
|---|---|---|---|
| 10,234,913 B1* | 3/2019 | Kho ......................... | H05K 3/36 |
| 10,299,397 B1* | 5/2019 | Chen ..................... | H05K 7/1429 |
| 11,018,452 B2* | 5/2021 | Wu .............................. | F16B 2/18 |
| 11,340,665 B2* | 5/2022 | Chang ..................... | G06F 1/186 |
| 11,372,459 B2* | 6/2022 | Tseng ........................ | F16B 2/22 |
| 2025/0021140 A1* | 1/2025 | Tseng .................... | H05K 7/1417 |

* cited by examiner

*Primary Examiner* — James Wu
(74) *Attorney, Agent, or Firm* — Muncy, Geissler, Olds & Lowe, P.C.

(57) ABSTRACT

A two-stage fixing device includes a base member positioned on a preset circuit board, and a positioning fastener with a holder base thereof positioned on the base member. The holder base has first and second positioning blocks used to resist a first interface card and a second interface card that are plugged into respective preset electrical connectors on the preset circuit board, thereby stably positioning them on the holder base. By moving the holder base and the operating portion of the clasp, the first and second elastic members on the holder base can each retreat and tilt through elastic compression deformation. Then, the first and second interface cards can be separated from the positioning fastener, so as to achieve the purpose of rapid positioning and disassembly of multiple interface cards in the present invention.

10 Claims, 8 Drawing Sheets

TWO-STAGE FIXING DEVICE

This application claims the priority benefit of Taiwan patent application number 112121101, filed on Jun. 6, 2023.

BACKGROUND OF THE INVENTION

1. Field of the Invention

The present invention relates to a two-stage fixing device, in particular to a device with integrated first positioning block and second positioning block on a holder base to resist a preset first interface card and a preset second interface card that are plugged into respective preset electrical connectors on the preset circuit board, thereby stably positioning them on the holder base. By moving the holder base and the operating portion of the clasp, the first and second elastic members on the holder base can each retreat and tilt through elastic compression deformation. Then, the preset first and second interface cards can be separated from the positioning fastener, so as to achieve the purpose of rapid positioning and disassembly of multiple interface cards in the present invention.

2. Description of the Related Art

The rapid development of the electronics industry has doubled the computing performance of computers or servers. In addition to the main components of the computer including the motherboard, central processing unit, memory and storage devices, the motherboard is also equipped with a variety of connectors with different interfaces to expand various peripheral devices. To expand various peripheral devices, interface cards are Equipped with multiple electronic components and corresponding circuit layouts.

However, most general hosts, laptops, or other electronic devices are limited by the size of the internal space and cannot be freely configured by users. In particular, the space for installing the motherboard and related components formed in the C and D sides of the notebook computer case is limited by the thickness, and the assembly of the motherboard and interface cards cannot be assembled vertically like a personal computer. Therefore, how to use the effective space to assemble more interface cards is the key to improve that those engaged in this industry urgently want to study.

SUMMARY OF THE INVENTION

Therefore, in view of the above-mentioned problems and deficiencies, the inventor collected relevant information, and after multiple evaluations and considerations, he designed the invention of this two-stage fixing device.

It is therefore a main object of the present invention to provide a two-stage fixing device, which comprises a base member, and a positioning fastener comprising a first elastic member, a clasp, a second elastic member and a pivot. The base member comprises a bottom plate with a positioning portion at a front end thereof for positioning on a preset circuit board, two side plates respectively extended upward from respective outer walls on both sides of an opposing of the bottom plate, a resisting plate connected between the two side plates, a flexible space formed between the two side plates and the resisting plate, and two assembly structures respectively located on the two side plates at an inner side corresponding to each other. The holder base comprises an accommodating chamber, two slideways respectively formed on two opposite sides of the accommodating chamber, two side guide plates respectively formed above the two slideways, two connecting portions respectively extended below the two side guide plates for assembly with the two assembly structures, a buckle groove and a blocking wall respectively formed corresponding to opposing front and rear sides of the accommodating chamber, a first positioning block formed above the buckle groove, a locating unit located on a bottom side of the holder base and positioned between the two side plates of the base member, a protruding portion protruding from a front end of the locating unit, a resisting groove formed above the protruding portion and a second positioning block located in the resisting groove. The first elastic member is stopped with one end thereof against the resisting plate. The clasp comprises a horizontal portion with a pushing portion at a front end thereof and an operating portion at an opposing rear end thereof, a vertical portion extending downward from a bottom side of the pushing portion and inserted into the accommodating chamber of the holder base, a connecting plate connected to said vertical portion, and a buckle portion protruding from a front side of the vertical portion corresponding to the buckle groove of the holder base and firmly engaged in the buckle groove through the pushing force of the second elastic member. The second elastic member is set in the accommodating chamber with two opposite ends thereof respectively resisting an inner side of the vertical portion and the blocking wall. The pivot is provided through the connecting plate and the second elastic member with two opposite ends thereof respectively positioned in the two slideways. By having an integrated first positioning block and a second positioning block on the holder base, the preset first interface card and the preset second interface card that are plugged into the respective preset electrical connector on the preset circuit board can rotate and resist, thereby stably positioning the on holder base. By moving the holder base and the operating portion of the clasp, the first elastic member and the second elastic member on the holder base can each retreat and tilt through elastic compression deformation. Then, the preset first interface card and the preset second interface card can be separated from the positioning fastener, so as to achieve the purpose of rapid positioning and disassembly of multiple interface cards in the present invention.

It is another object of the present invention to provide a two-stage fixing device, wherein each assembly structure comprises a positioning bump protruding inward and a stop arm located between the positioning bump and the resisting plate and extending to both sides. The stop arm comprises a stop block protruding in the direction of the positioning bump. The holder base further comprises two connecting blocks respectively protruding downward from the two connecting portions, two positioning grooves respectively formed between respective outer wall surfaces of the two side guide plates and the connecting blocks for the respective positioning bumps to pass through, and two buckle blocks respectively protruding from two opposite sides at an opposite other end of the protruding portion of the locating unit and accommodated on a bottom side of the stop arm.

It is still another object of the present invention to provide a two-stage fixing device, wherein the clasp further comprises two limiting blocks respectively extended from the horizontal portion toward both sides of the connecting plate for limiting two resisting end portions of the second elastic member, and two limiting spaces respectively defined by opposite inner sides of the limiting blocks and the vertical portion for accommodating the two resisting end portions of the second elastic member.

It is still another object of the present invention to provide a two-stage fixing device, wherein the clasp further comprises an axle hole located on the connecting plate, and the pivot passes through the axle hole of the clasp with the two opposite ends thereof respectively positioned in the two slideways of said holder base.

It is still another object of the present invention to provide a two-stage fixing device, wherein the second elastic member is a torsion spring, the second elastic member is wound in the middle to form two positioning rings, and a penetration channel is formed in each positioning ring for the pivot to pass through, the second elastic member is formed with a deformation metal wire segment with two ends thereof bent against the blocking wall, two resisting end portions are formed with metal free wire ends and stopped against the inside of the vertical portion of the clasp.

It is still another object of the present invention to provide a two-stage fixing device, wherein the first positioning block of the holder base is composed of a semicircular arc-shaped sheet body; a preset first interface card and a preset second interface card are plugged into respective preset electrical connectors provided on the preset circuit board, so that after the preset first interface card and the preset second interface card are rotated and pushed against the pushing portion of the clasp respectively, a first resisting end of the suspended end of the preset first interface card is stopped against the first positioning block, and a second resisting end of the suspended end of the preset second interface card is stopped against the second positioning block, said second resisting end can extend into said resisting groove and resist said second positioning block.

DETAILED DESCRIPTION OF THE PREFERRED EMBODIMENT

Please refer to FIGS. 1, 2, 3, and 4, which are a three-dimensional appearance view of the two-stage fixing device of the present invention, another three-dimensional two-stage fixing device view of the two-stage fixing device of the present invention, a three-dimensional exploded view of the two-stage fixing device of the present invention, and another three-dimensional exploded view of the two-stage fixing device of the present invention. The two-stage fixing device of the present invention mainly comprises a base member 1 and a positioning fastener 2, and the connection relationship between the aforementioned components is as follows:

The base member 1 comprises a bottom plate 11 with a positioning portion 111 at the front end and a positioning hole 1110 on the positioning portion 111 for penetration and fixation by a preset fastener (not shown in the figure), two side plates 112 respectively extended upward from the outer walls on both sides of the other end of the bottom plate 11, a resisting plate 1121 connected between the two side plates 112, a flexible space 110 formed between the two side plates 112 and the resisting plate 1121, and two assembly structures 12 respectively located on the two side plates 112 at an inner side corresponding to each other. Each assembly structure 12 comprises a positioning bump 121 protruding inward, and a stop arm 122 located between the positioning bump 121 and the resisting plate 1121 and extending to both sides. The stop arm 122 has a stop block 1221 protruding in the direction of the positioning bump 121.

The positioning fastener 2 comprises a holder base 21, a clasp 22, a first elastic member 2151, a second elastic member 23, and a pivot 24. The holder base 21 comprises an accommodating chamber 210, two slideways 2101 respectively formed on two opposite sides of the accommodating chamber 210, two side guide plates 211 respectively formed above the two slideways 2101, two finger rods 2111 respectively protruding from the outer wall surfaces of the two side guide plates 211, two connecting portions 212 respectively extended below the two side guide plates 211 for assembly with the two assembly structures 12, two connecting blocks 2121 respectively protruding downward from the two connecting portions 212, two positioning grooves 2120 respectively formed between the holder base 21 and the connecting blocks 2121 for the respective positioning bumps 121 to pass through, a buckle groove 2102 and a blocking wall 2103 respectively formed corresponding to the front and rear sides of the accommodating chamber 210, a first positioning block 213 formed above the buckle groove 2102, a locating unit 214 located on the bottom side of the holder base 21 and positioned between the two side plates 112 of the base member 1, a protruding portion 2141 protruding from the front end of the locating unit 214, a resisting groove 2140 formed between the holder base 21 and the protruding portion 2141, a second positioning block 2142 located in the resisting groove 2140, two buckle blocks 2143 respectively protruding from two opposite sides at the other end of the protruding portion 2141, an elastic member groove 215 provided on the rear side of the holder base 21 corresponding to the position of the flexible space 110, and a cover plate 216 resisting above the resisting plate 1121.

The first elastic member 2151 is set in the elastic member groove 215 with its one end against the wall surface of the resisting plate 1121.

The clasp 22 comprises a horizontal portion 221 with a pushing portion 2211 at the front end and an operating portion 2212 at the rear end, a vertical portion 222 extending downward from the bottom side of the pushing portion 2211 and inserted into the accommodating chamber 210 of the holder base 21, a connecting plate 223 connected to the vertical portion 222, and a buckle portion 2221 protruding from the front side of the vertical portion 222 corresponding to the buckle groove 2102 of the holder base 21. The buckle portion 2221 is firmly engaged in the buckle groove 2102 through the pushing force of the second elastic member 23.

The second elastic member 23 is set in the accommodating chamber 210 with its two ends respectively resisting the inner side of the vertical portion 222 and the blocking wall 2103.

The pivot 24 is provided through the connecting plate 223 and the second elastic member 23 with its two ends respectively positioned in the two slideways 2101.

The two side guide plates 211 of the above-mentioned holder base 21 each have a guide inclined edge 2112 forming a smooth downward arc toward the rear side. The first positioning block 213 of the holder base 21 is composed of a semicircular arc-shaped sheet body. The bottom plate 11 of the base member 1 is positioned on a preset circuit board 3 through the positioning portion 111. A preset first interface card 4 and a preset second interface card 5 are plugged into respective preset electrical connectors (not shown in the figures) provided on the preset circuit board 3. After the preset first interface card 4 and the preset second interface card 5 are rotated and pushed against the pushing portion 2211 of the clasp 22 respectively, the first resisting end 41 of the suspended end of the preset first interface card 4 is stopped against the first positioning block 213, and the second resisting end 51 of the suspended end of the preset second interface card 5 is stopped against the second positioning block 2142, thereby completing the positioning of the preset first interface card 4 and the preset second interface card 5 in the present invention.

The top side of the pushing portion 2211 of the clasp 22 has a guide bevel 2213 that guides the preset first interface card 4 and the preset second interface card 5 to rotate downward, and the guide bevel 2213 is in the shape of an arc. A limiting surface 2214 is formed on the bottom side of the pushing portion 2211, and a sliding surface 2215 is formed on the bottom side of the operating portion 2212 relative to the other side of the pushing portion 2211. The clasp 22 further comprises two limiting blocks 224 respectively extended from the horizontal portion 221 toward both sides of the connecting plate 223 for limiting two resisting end portions 231 of the second elastic member 23. The opposite inner sides of the limiting blocks 224 and the vertical portion 222 form a respective limiting space 2240 for accommodating the resisting end portions 231 of the second elastic member 23. The connecting plate 223 of the clasp 22 is further provided with an axle hole 2230 for the pivot 24 to pass through, and the two opposite positioning ends 241 of the pivot 24 are positioned in the two slideways 2101 of the holder base 21 to form positioning.

The above-mentioned second elastic member 23 is a torsion spring. The second elastic member 23 is wound in the middle to form two positioning rings 233, and a penetration channel 2330 is formed in each positioning ring 233 for the pivot 24 to pass through. The second elastic member 23 is formed with a deformation metal wire segment 232 with two ends bent against the blocking wall 2103, and the two resisting end portions 231 are formed with metal free wire ends and stopped against the inside of the vertical portion 222 of the clasp 22.

Figure 1:
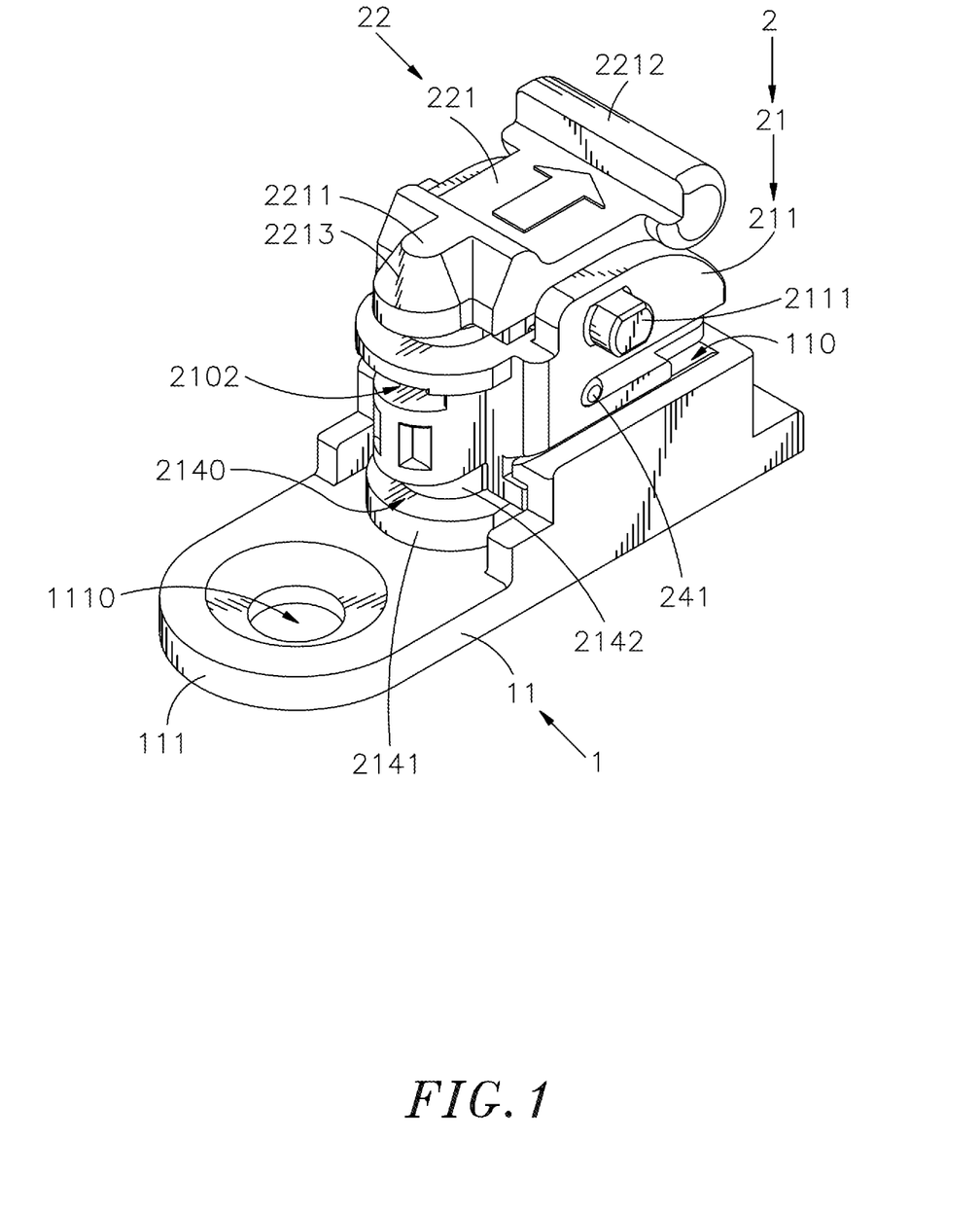
FIG. 1 is a three-dimensional appearance view of the two-stage fixing device of the present invention.
Figure 2:
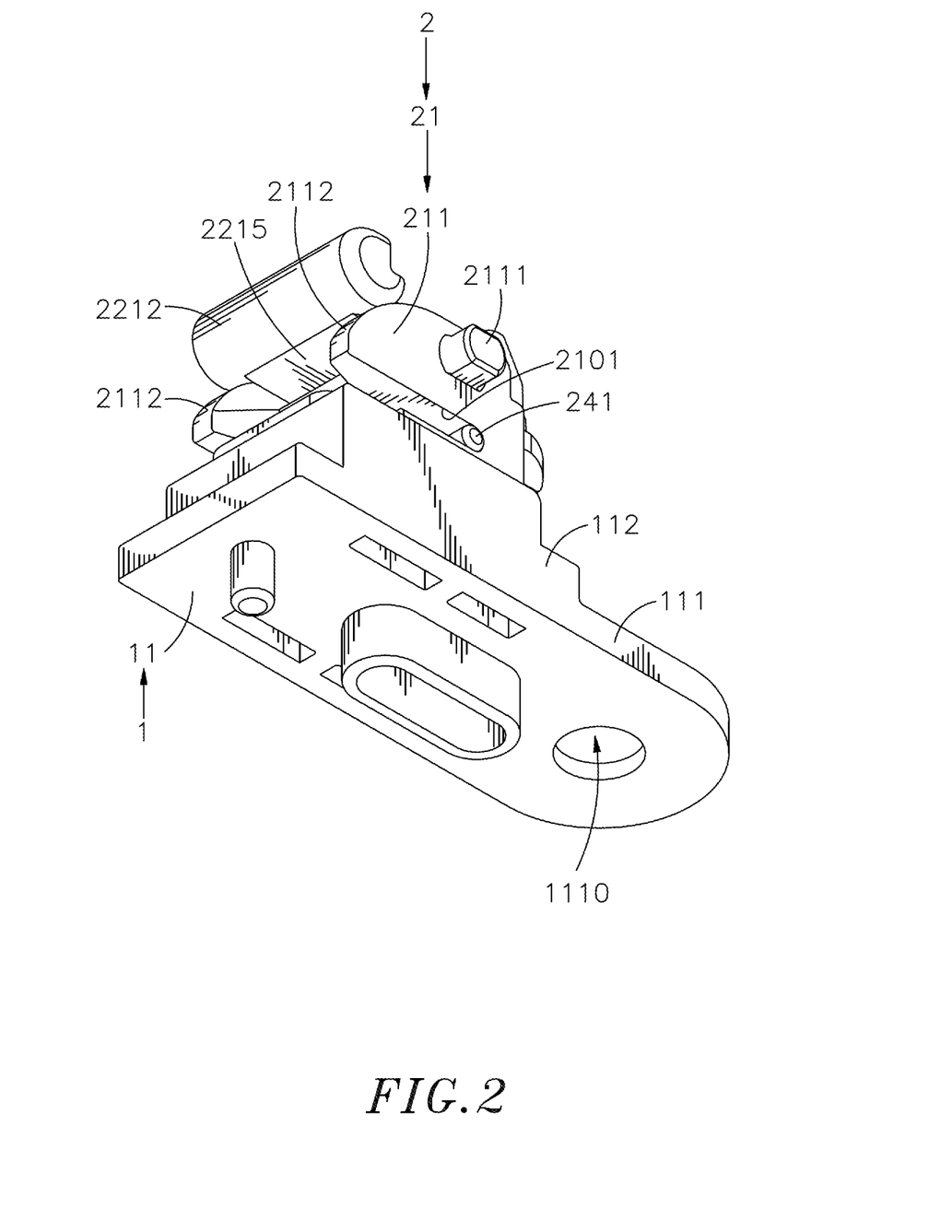
FIG. 2 is another three-dimensional two-stage fixing device view of the two-stage fixing device of the present invention.
Figure 3:
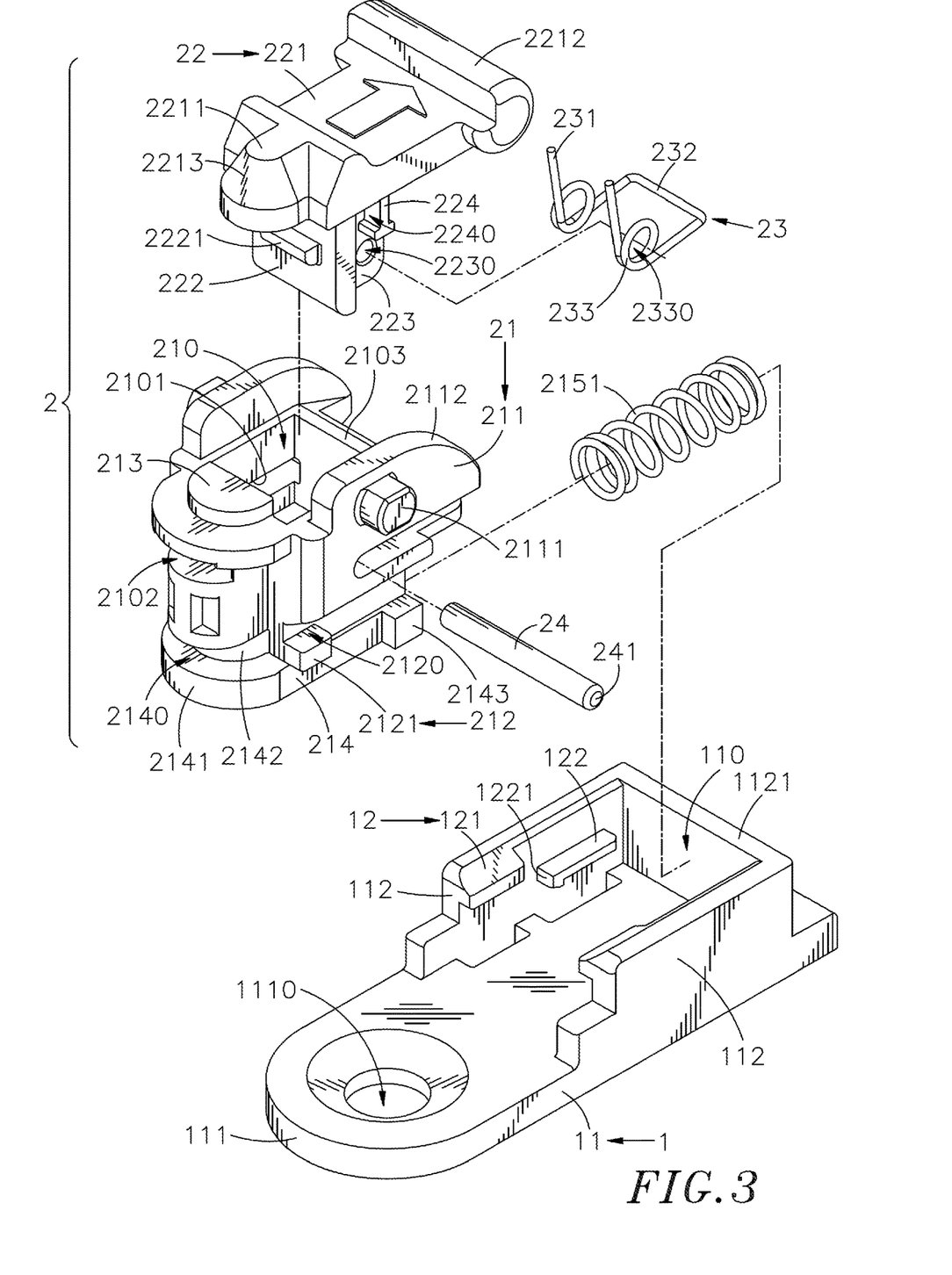
FIG. 3 is a three-dimensional exploded view of the two-stage fixing device of the present invention.
Figure 4:
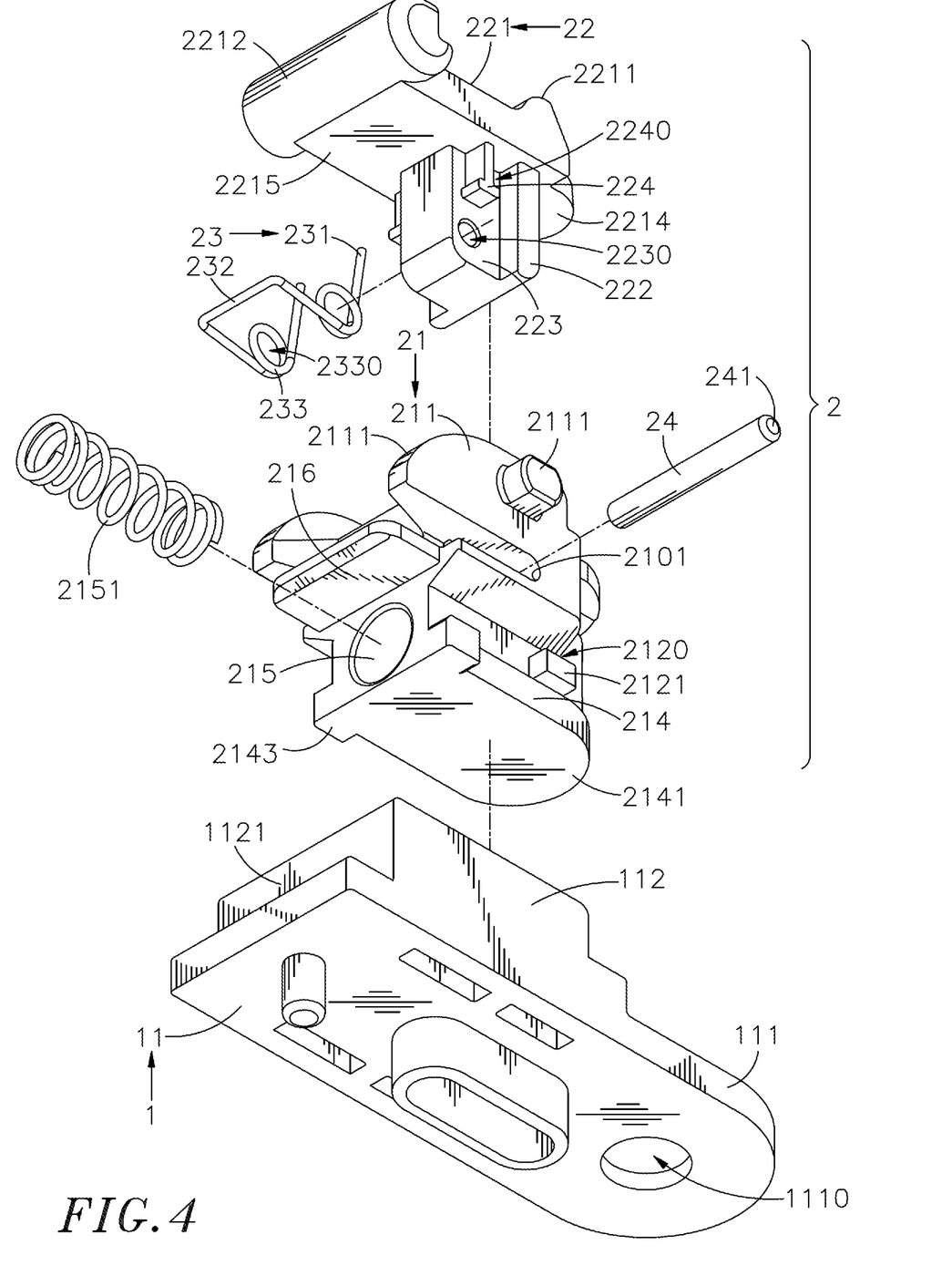
FIG. 4 is another three-dimensional exploded view of the two-stage fixing device of the present invention.

When assembling the present invention, first assemble the positioning portion 111 of the base member 1 on the preset circuit board 3, and then set the locating unit 214 of the holder base 21 on the bottom plate 11 between two side plates 112 and position the positioning bumps 121 of the assembly structures 12 on the two side plates 112 in the positioning grooves 2120 formed between the holder base 21 and the connecting blocks 2121. The two buckle blocks 2143 of the locating unit 214 are then respectively accommodated on the bottom side of the two stop arms 122, and the first elastic member 2151 located in the elastic member groove 215 on the rear side of the holder base 21 is stopped against the resisting plate 1121, and the buckle blocks 2143 on both sides of the holder base 21 pushed by the first elastic member 2151 are blocked by the stop blocks 1221 at the respective one end of the stop arms 122 and cannot be pushed out of the base member 1. Then extend the two resisting end portions 231 of the second elastic member 23 into the limiting spaces 2240 on both sides of the connecting plate 223 of the clasp 22 respectively, and then use the limiting blocks 224 to limit the two resisting end portions 231. Then the two penetration channels 2330 of the second elastic member 23 are simultaneously aligned with the axle hole 2230 located on the connecting plate 223. Then press the vertical portion 222 and connecting plate 223 of the clasp 22 and the second elastic member 23 from top to bottom simultaneously into the accommodating chamber 210 of the holder base 21, so that the resisting end portions 231 of the second elastic member 23 are resisted on the inner side of the vertical portion 222 and the deformation metal wire segment 232 is resisted on the blocking wall 2103, and the two penetration channels 2330 of the second elastic member 23 and the axle hole 2230 of the connecting plate 223 are aligned with the two slideways 2101 of the holder base 21 at the same time. The pivot 24 is then passed through the two slideways 2101, the two penetration channels 2330 and the axle hole 2230, and the two positioning ends 241 of the pivot 24 are positioned in the two slideways 2101 to complete the assembly of the two-stage fixing device.

Figure 5:
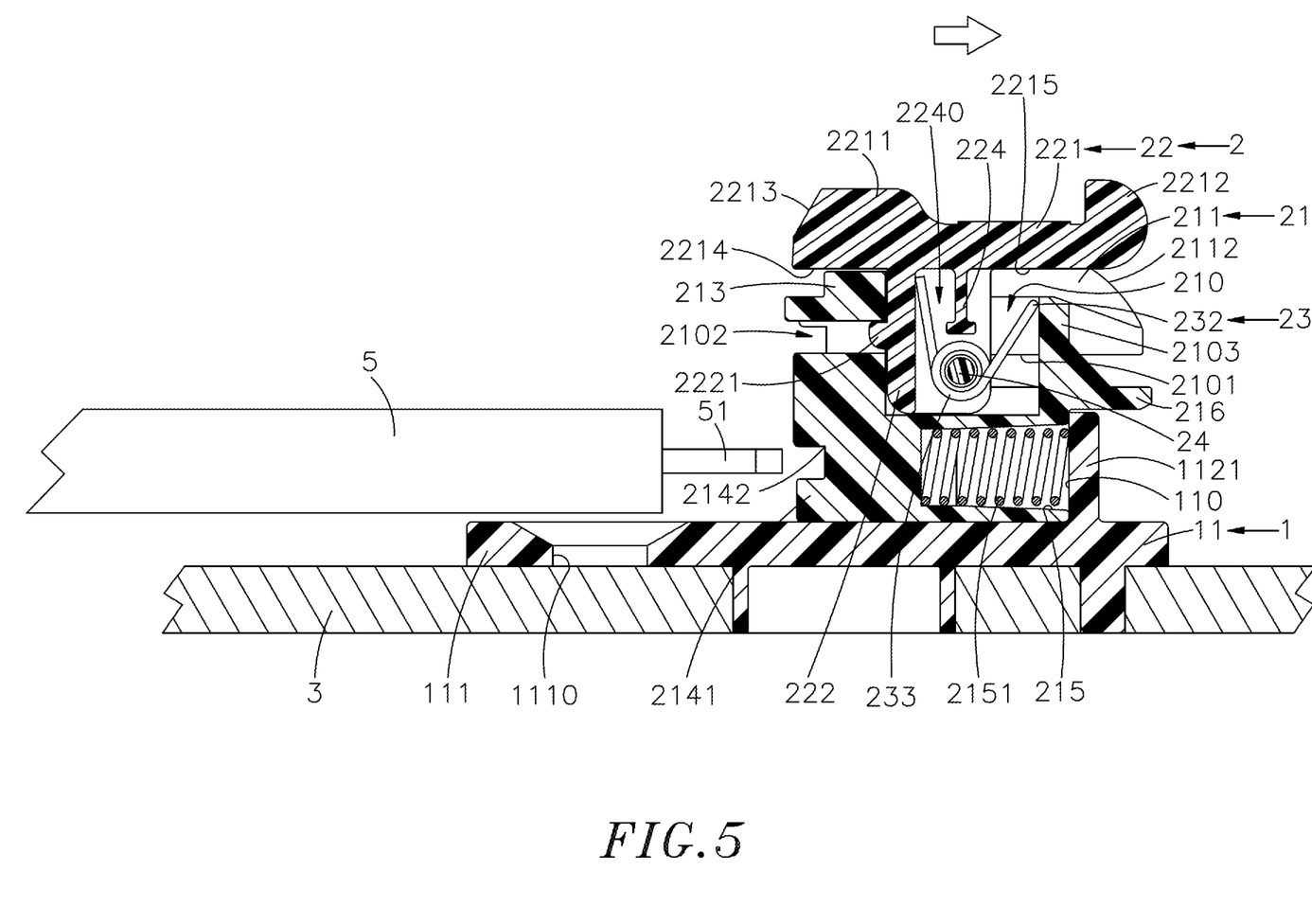
FIG. 5 is a schematic diagram of the assembly operation of the two-stage fixing device of the present invention (I).
Figure 6:
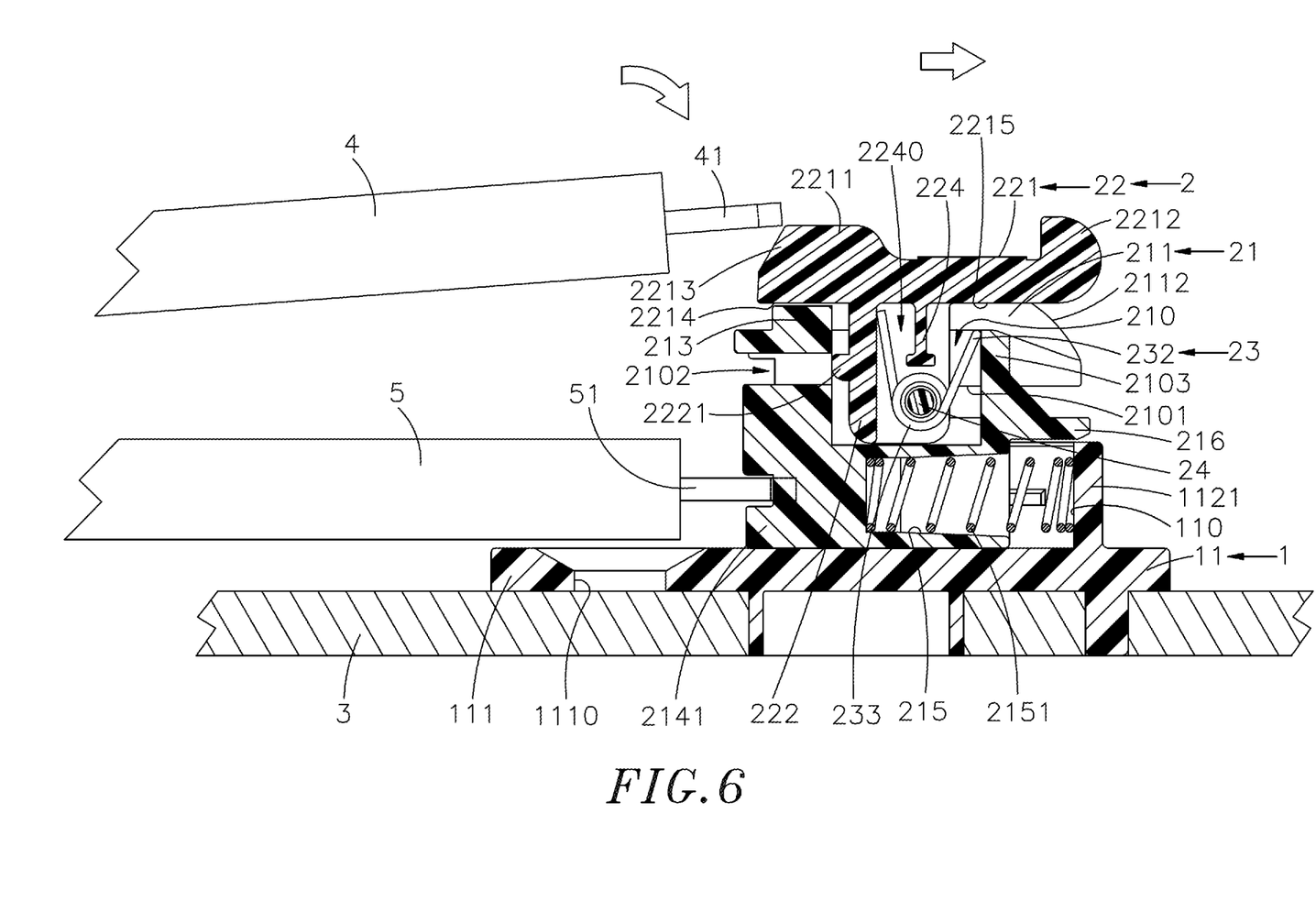
FIG. 6 is a schematic diagram of the assembly operation of the two-stage fixing device of the present invention (II).
Figure 7:
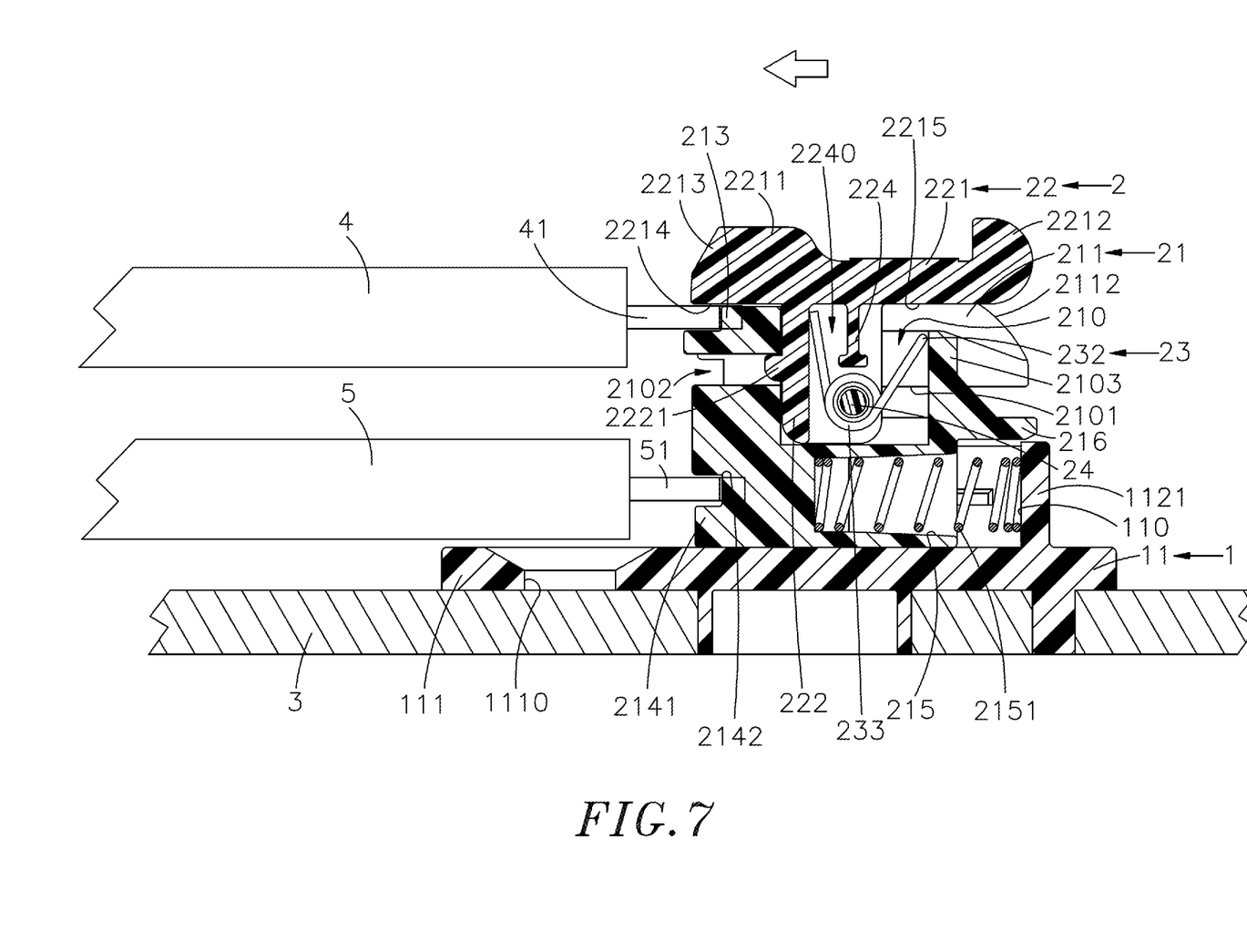
FIG. 7 is a schematic diagram of the assembly operation of the two-stage fixing device of the present invention (III).

Please refer to FIGS. 5, 6 and 7, which are schematic diagrams (I), (II) and (III) of the assembly operation of the two-stage fixing device of the present invention. It can be clearly seen from the figures that when the present invention is actually applied, the preset first interface card 4 and the preset second interface card 5 need to be plugged into the docking spaces of the respective electrical connectors (not shown in the figures) of the preset circuit board 3 to create an electrical connection. When the first resisting end 41 and the second resisting end 51 extending from the suspended board edges of the preset first interface card 4 and the preset second interface card 5 are to be positioned in the positioning fastener 2 on the preset circuit board 3, first, use the preset electrical connectors as the rotation axis, and rotate the preset first interface card 4 and the preset second interface card 5 toward the pushing portion 2211 and the protruding portion 2141 respectively. By pulling the finger rods 2111 on the outer walls of the two side guide plates 211, the holder base 21 can be pushed toward the resisting plate 1121, thereby driving the first elastic member 2151 in the holder base 21 to undergo elastic compression deformation. After the second resisting end 51 of the preset second interface card 5 and the resisting groove 2140 of the locating unit 214 are aligned, the finger rods 2111 are released, so that the first elastic member 2151 can push the holder base 21 back to its original position through the force of elastic recovery, and then the second resisting end 51 can extend into the resisting groove 2140 and resist the second positioning block 2142 to form a resisting position (as shown in FIGS. 5 and 6). At this time, the pushing portion 2211 will be retracted by the horizontal stress of the preset first interface card 4 and drive the pivot 24 to move along the two slideways 2101 toward the rear direction of the holder base 21, and make the second elastic member 23 produce elastic compression deformation, so that the first resisting end 41 of the preset first interface card 4 can be moved vertically downward into the bottom side of the limiting surface 2214 of the pushing portion 2211. The first positioning block 213 of the holder base 21 corresponding to the limiting surface 2214 is composed of a semicircular arc-shaped sheet body. The first positioning block 213 provides a resisting positioning for the first resisting end 41 of the preset first interface card 4 (as shown in FIGS. 6 and 7). At the same time, the clasp 22 removes the resisting force of the preset first interface card 4, causing the second elastic member 23 to generate an elastic restoring force, thereby driving the pushing portion 2211, the second elastic member 23 and the pivot 24 to return to their original positions. The top surface of the preset first interface card 4 is limited by the limiting surface 2214 of the clasp 22, and the side and bottom surfaces of the preset first interface card 4 are stored at the periphery of the first positioning block 213. Through the above, the positioning structure of the two-stage fixing device with the preset first interface card 4 and the preset second interface card 5 is completed.

Figure 8:
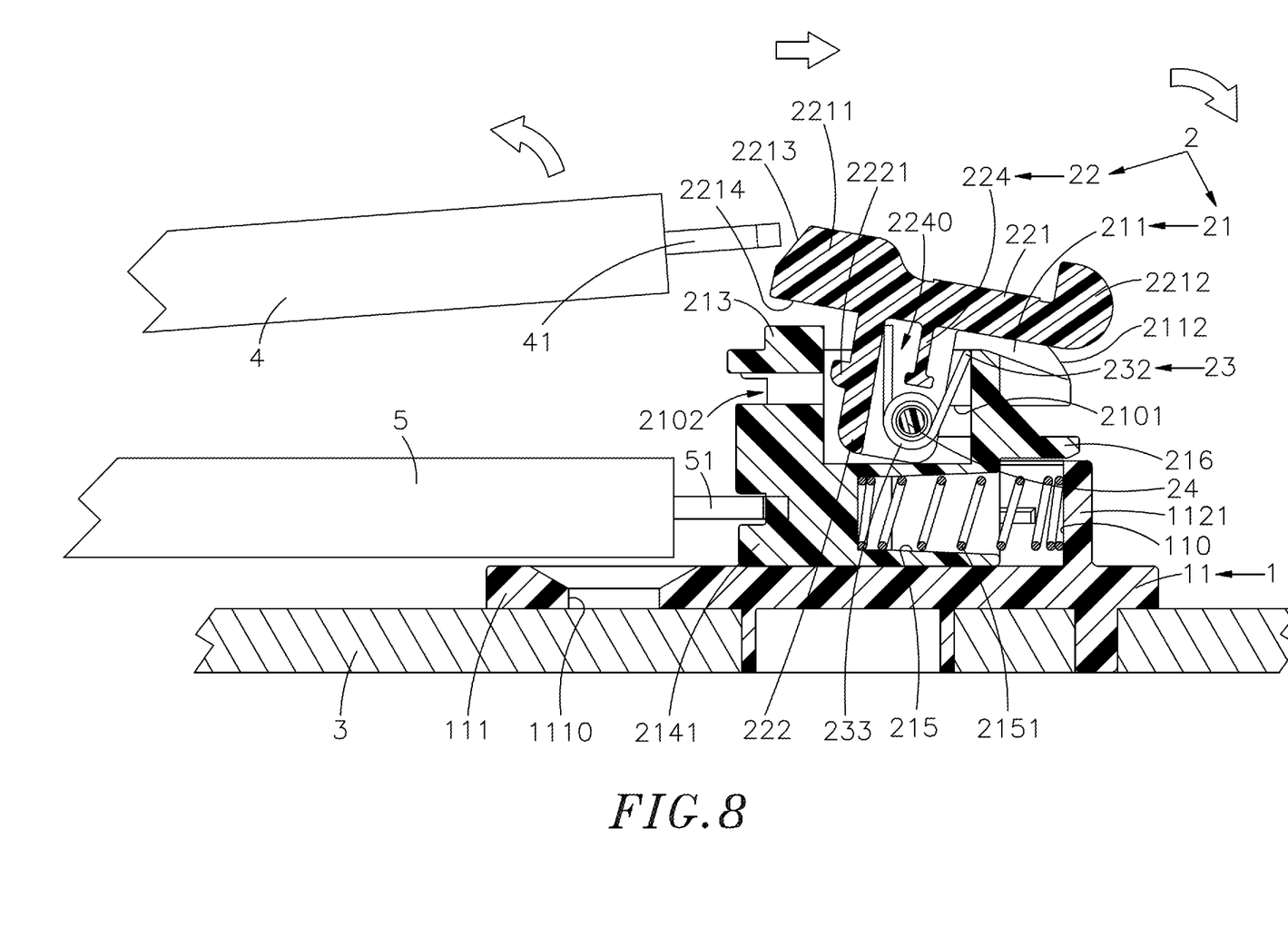
FIG. 8 is a schematic diagram of the assembly operation of the two-stage fixing device of the present invention (IV).

Please refer to FIG. 8, which a schematic diagram (IV) of the assembly operation of the two-stage fixing device of the present invention. When you want to perform the unlocking cooperation between the positioning fastener 2 and the preset first interface card 4 and the preset second interface card 5, first, apply force to the operating portion 2212 of the clasp 22 toward the rear side of the holder base 21, so that the buckle portion 2221 is detached from the buckle groove 2102 of the holder base 21, and the pivot 24 is moved in the slideways 2101 a predetermined distance, then apply force again to rotate the operating portion 2212 downward with the pivot 24 as the center, thereby causing the second elastic member 23 to produce a great amount of compression, and also causing the sliding surface 2215 on the bottom side of the operating portion 2212 to slide toward the rear side of the holder base 21 along the guide inclined edges 2112 of the two side guide plates 211. At this time, the clasp 22 will generate a predetermined tilt angle and push the pushing portion 2211 upward, so that the preset first interface card 4 is affected by the elastic restoring force of the preset conductive terminals in the preset electrical connector, so that the end face away from the preset electrical connector is tilted. Then the first resisting end 41 of the preset first interface card 4 is rotated upward away from the first positioning block 213 and the pushing portion 2211. After the preset first interface card 4 is detached, by pulling the finger rods 2111 on the outer walls of the two side guide plates 211, the holder base 21 is pushed toward the resisting plate 1121. This then drives the first elastic member 2151 in the holder base 21 to undergo elastic compression deformation, so that the preset second interface card 5 is affected by the elastic restoring force of the preset conductive terminals in the preset electrical connector, causing the end surface away from the preset electrical connector to tilt. Then the second resisting end 51 of the preset second interface card 5 is rotated upward and separated from the second positioning block 2142. The preset first interface card 4 and the preset second interface card 5 can be detached and taken out from the respective preset electrical connectors. Then by removing the force on the operating portion 2212 of the clasp 22 and the finger rods 2111 of the two side guide plates 211, the pushing portion 2211, the second elastic member 23, the pivot 24 and the holder base 21 are returned to their original positions, and the buckle portion 2221 of the clasp 22 is buckled into the buckle groove 2102 of the holder base 21 to achieve the purpose of separating the preset first interface card 4 and the preset second interface card 5.

The present invention has the following advantages: Provide a quick positioning and disassembly structure for multiple interface cards. The integrated first positioning block 213 and the second positioning block 2142 are provided on the holder base 21 to resist the first resisting end 41 of the preset first interface card 4 and the second resisting end 51 of the preset second interface card 5, and the holder base 21, the preset first interface card 4 and the preset second interface card 5 are firmly positioned by the elastic push of the first elastic member 2151 and the second elastic member 23. And by moving the holder base 21 and the operating portion 2212, the first elastic member 2151 and the second elastic member 23 can each retreat and tilt through elastic compression deformation. Then, the preset first interface card 4 and the preset second interface card 5 can be separated from the positioning fastener 2, so as to achieve the purpose of rapid positioning and disassembly of multiple interface cards in the present invention.

The above description is only the preferred embodiment of the present invention, and does not limit the patent scope of the present invention. Therefore, all simple modifications and equivalent structural changes made by using the description and drawings of the present invention shall be included in the patent scope of the present invention and shall be clearly stated.

In summary, the two-stage fixing device of the present invention can indeed achieve its effect and purpose when used in actual applications. Therefore, the present invention is a research and development with excellent practicality. In order to meet the application requirements for an invention patent, I filed the application in accordance with the law and hope that the review committee will approve the case as soon as possible to protect the inventor's hard work on research and development and creation. If the review committee has any doubts, please feel free to write a letter for instructions. The inventor will do his best to cooperate.

What the invention claimed is:

1. A two-stage fixing device, comprising:
a base member, said base member comprising a bottom plate with a positioning portion at a front end thereof for positioning on a preset circuit board, two side plates respectively extended upward from respective outer walls on both sides of an opposing rear end of said bottom plate, a resisting plate connected between said two side plates, a flexible space formed between said two side plates and said resisting plate, and two assembly structures respectively located on said two side plates at an inner side corresponding to each other;
a positioning fastener, said positioning fastener comprising a holder base, a clasp, a first elastic member, a second elastic member and a pivot, said holder base comprising an accommodating chamber, two slideways respectively formed on two opposite sides of said accommodating chamber, two side guide plates respectively formed above said two slideways, two connecting portions respectively extended below said two side guide plates for assembly with said two assembly structures, a buckle groove and a blocking wall respectively formed corresponding to opposing front and rear sides of said accommodating chamber, a first positioning block formed above said buckle groove, a locating unit located on a bottom side of said holder base and positioned between said two side plates of said base member, a protruding portion protruding from a front end of said locating unit, a resisting groove formed above said protruding portion and a second positioning block located in said resisting groove, said first elastic member being stopped with one end thereof against a wall surface of said resisting plate, said clasp comprising a horizontal portion with a pushing portion at a front end thereof and an operating portion at an opposing rear end thereof, a vertical portion extending downward from a bottom side of said pushing portion and inserted into said accommodating chamber of said holder base, a connecting plate connected to said vertical portion, and a buckle portion protruding from a front side of said vertical portion corresponding to said buckle groove of said holder base and firmly engaged in said buckle groove through a pushing force of said second elastic member, said second elastic member being set in said accommodating chamber with two opposite ends thereof respectively resisting an inner side of said vertical portion and said blocking wall, said pivot being provided through said connecting plate and said second elastic member with two opposite ends thereof respectively positioned in said two slideways.

2. The two-stage fixing device as claimed in claim 1, wherein each said assembly structure comprises a positioning bump protruding inward and a stop arm located between said positioning bump and said resisting plate and extending to both sides, said stop arm comprising a stop block protruding in a direction of said positioning bump; said holder base further comprises two connecting blocks respectively protruding downward from said two connecting portions, two positioning grooves respectively formed between respective outer wall surfaces of said two side guide plates and said connecting blocks for the respective said positioning bumps to pass through, and two buckle blocks respectively protruding from two opposite sides at an opposite other end of said protruding portion of said locating unit and accommodated on a bottom side of said stop arm.

3. The two-stage fixing device as claimed in claim 1, wherein said base member further comprises a positioning hole located on said positioning portion for penetration and fixation by a preset fastener.

4. The two-stage fixing device as claimed in claim 1, wherein said holder base further comprises two finger rods respectively protruding from respective outer wall surfaces of said two side guide plates.

5. The two-stage fixing device as claimed in claim 1, wherein said two side guide plates of said holder base each form a guide inclined edge with a smooth downward arc toward a rear side thereof.

6. The two-stage fixing device as claimed in claim 1, wherein said clasp further comprises a guide bevel located on a top side of said pushing portion in a shape of an arc for guiding a preset first interface card to rotate downward, a limiting surface formed on a bottom side of said pushing portion, and a sliding surface formed on a bottom side of said operating portion relative to the other side of said pushing portion.

7. The two-stage fixing device as claimed in claim 1, wherein said clasp further comprises two limiting blocks respectively extended from said horizontal portion toward both sides of said connecting plate for limiting two resisting end portions of said second elastic member, and two limiting spaces respectively defined by opposite inner sides of said limiting blocks and said vertical portion for accommodating said two resisting end portions of said second elastic member.

8. The two-stage fixing device as claimed in claim 1, wherein said clasp further comprises an axle hole located on said connecting plate; said pivot passes through said axle hole of said clasp with the two opposite ends thereof respectively positioned in said two slideways of said holder base.

9. The two-stage fixing device as claimed in claim 1, wherein said second elastic member is a torsion spring, said second elastic member is wound in a middle to form two positioning rings, and a penetration channel formed in each said positioning ring for said pivot to pass through, said second elastic member is formed with a deformation metal wire segment with two ends thereof bent against said blocking wall, two resisting end portions are formed with metal free wire ends and stopped against an inside of said vertical portion of said clasp.

10. The two-stage fixing device as claimed in claim 1, wherein said first positioning block of said holder base is composed of a semicircular arc-shaped sheet body; a preset first interface card and a preset second interface card are plugged into respective preset electrical connectors provided on said preset circuit board, so that after said preset first interface card and said preset second interface card are rotated and pushed against said pushing portion of said clasp respectively, a first resisting end of a suspended end of said preset first interface card is stopped against said first positioning block, and a second resisting end of a suspended end of said preset second interface card is stopped against said second positioning block, said second resisting end can extend into said resisting groove and resist said second positioning block.

\* \* \* \* \*